(12) United States Patent
Koch et al.

(10) Patent No.: US 11,061,331 B2
(45) Date of Patent: Jul. 13, 2021

(54) METHOD FOR DETERMINING A STRUCTURE-INDEPENDENT CONTRIBUTION OF A LITHOGRAPHY MASK TO A FLUCTUATION OF THE LINEWIDTH

(71) Applicant: Carl Zeiss SMT GmbH, Oberkochen (DE)

(72) Inventors: Markus Koch, Neu-Ulm (DE); Dirk Hellweg, Langenau (DE); Renzo Capelli, Heidenheim (DE); Martin Dietzel, Giengen a. d. Brenz (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 232 days.

(21) Appl. No.: 16/280,469

(22) Filed: Feb. 20, 2019

(65) Prior Publication Data

US 2019/0258176 A1    Aug. 22, 2019

(30) Foreign Application Priority Data

Feb. 21, 2018 (DE) .......................... 102018202639.4

(51) Int. Cl.
    *G03F 7/20*    (2006.01)
    *G03F 1/84*    (2012.01)

(52) U.S. Cl.
    CPC .............. *G03F 7/2004* (2013.01); *G03F 1/84* (2013.01); *G03F 7/2002* (2013.01); *G03F 7/706* (2013.01); *G03F 7/70433* (2013.01); *G03F 7/70641* (2013.01)

(58) Field of Classification Search
    CPC ........ G03F 1/84; G03F 7/2002; G03F 7/2004; G03F 7/70433; G03F 7/706; G03F 7/70641
    USPC ...................................... 430/5, 30
    See application file for complete search history.

(56) References Cited

U.S. PATENT DOCUMENTS

| | | | |
|---|---|---|---|
| 10,068,325 | B2 | 9/2018 | Matejka et al. |
| 2011/0181868 | A1 | 7/2011 | Stokowski |
| 2011/0212389 | A1 | 9/2011 | Hirukawa et al. |
| 2013/0063716 | A1 | 3/2013 | Schroeter et al. |
| 2013/0083321 | A1 | 4/2013 | Wack et al. |
| 2014/0375988 | A1 | 12/2014 | Ito et al. |
| 2015/0276378 | A1 | 10/2015 | Shcherbakov et al. |
| 2015/0323786 | A1 | 11/2015 | Kita |
| 2019/0258170 | A1 | 8/2019 | Koch et al. |

FOREIGN PATENT DOCUMENTS

| | | | | |
|---|---|---|---|---|
| CN | 102597873 | 7/2012 | ............... | G03F 1/44 |
| CN | 104395985 | 3/2015 | ........... | H01L 21/027 |
| DE | 102 20 815 | 11/2003 | ............... | G21K 7/00 |
| DE | 102 20 816 | 11/2003 | ............... | G21K 7/00 |
| JP | 2011-203245 | 10/2011 | ........... | G01N 21/956 |
| JP | 2012-531042 | 12/2012 | ........... | H01L 21/027 |
| JP | 2019-164339 | 9/2019 | ............... | G03F 1/84 |
| WO | WO 2013/118543 | 8/2013 | ............ | G01B 11/30 |
| WO | WO 2016/012426 | 1/2016 | ............ | G02B 17/08 |

OTHER PUBLICATIONS

The Japanese Notification of Reasons for Rejection for Japanese Application No. JP 2019-029050 dated Apr. 13, 2020 (with English Translation).
The Notice of Reasons for Rejection issued by the Korean Intellectual Property Office for Korean Patent Application No. 10-2019-0019784 dated Oct. 16, 2020 (with English Translation).
German Examination Report for German Application No. DE 10 2018 202 639.4 dated Oct. 22, 2018 (with English Translation).
Claus et al. "Aberration estimation using EUV mask roughness," *Extreme Ultraviolet* (EUV) *Lithography VI*, Feb. 23-26, 2015, San Jose, California, USA. Bellingham, Wash.; Proceedings of SPIE; vol. 9422, pp. 9422112-1-942214-6, (Mar. 19, 2015).
Hellweg et al., "Actinic Review of EUV Masks: Performance Data and Status of the AIMS™ EUV System," Jun. 3, 2017, Zeiss, "https://www.zeiss.com/content/dam/smt/downloads/products_and_solutions/photomask-systems/Publications/spie_2017_paper.pdf".
Noordman et al. "Speckle in optical lithography and its influence on linewidth roughness"; *J. Micro/Nanolith*. MEMS MOEMS, vol. 8, No. 4, pp. 043002-1-043002-10 (Oct.-Dec. 2009).
Shanker, Aamod et al. "Off-axis aberration estimation in an EUV microscope using natural speckle," *Imaging Systems and Applications: part of Imaging and Applied Optics*, Jul. 25-28, 2016, Heidelberg, Germany. Washington, D.C., USA: OSA, The Optical Society, 2016.
The Chinese Office Action and Search Report for Chinese Application No. CN 201910135818.7, dated Nov. 2, 2020 (with English Translation).

*Primary Examiner* — Christopher G Young
(74) *Attorney, Agent, or Firm* — Fish & Richardson P.C.

(57) ABSTRACT

For determining a structure-independent contribution of a lithography mask to a fluctuation of the linewidth, recorded 2D intensity distributions ($15_{zi}$) of an unstructured measurement region of a lithography mask are evaluated in a spatially resolved manner.

10 Claims, 5 Drawing Sheets

METHOD FOR DETERMINING A STRUCTURE-INDEPENDENT CONTRIBUTION OF A LITHOGRAPHY MASK TO A FLUCTUATION OF THE LINEWIDTH

CROSS REFERENCE TO RELATED APPLICATION

This application claims priority under 35 U.S.C. § 119 to German Application DE 10 2018 202 639.4, filed on Feb. 21, 2018, the entire content of which is incorporated herein by reference.

TECHNICAL FIELD

The invention relates to a method for determining a structure-independent contribution of a lithography mask to a fluctuation of the linewidth. The invention additionally relates to a metrology system for carrying out such a method.

SUMMARY

One of the crucial parameters for characterizing the quality of a lithography mask is the fluctuation of the linewidth (LWR, linewidth roughness). This parameter has a direct influence on the smallest feature size that is producible with this mask. It has been recognized according to the invention that inhomogeneities always present in the lithography mask make a structure-independent contribution to the fluctuation of the linewidth.

In a general aspect of the invention, a method is provided for determining a structure-independent contribution of a lithography mask to a fluctuation of the linewidth. In another general aspect of the invention, a metrology system is provided for carrying out such a method.

These aspects are achieved by means of the features of the independent claims.

The heart of the invention consists in recording a focus stack of a measurement region which is free of structures to be imaged, and in evaluating the recorded 2D intensity distributions in a spatially resolved manner. Provision is made, in particular, for evaluating the intensity variations attributable to so-called speckles in the aerial images of the lithography mask.

The lithography mask can be a finished lithography mask having structures to be imaged. It can also be a blank for producing such a lithography mask. Such blanks are also referred to as mask blanks. It can also be an intermediate product which occurs during the production of a lithography mask from a mask blank. Hereinafter, masks, blanks and intermediate products are referred to equally as lithography masks, for simplification.

The measurement region is free of structures to be imaged. In the case of a mask blank, the entire mask is free of structures to be imaged, that is to say unstructured.

The mask, in particular the measurement region, is in particular purely reflective or purely absorbent.

The method according to the invention serves in particular for determining a lower limit value for a minimum fluctuation of the linewidth that is achievable with a given mask. This information can be used in particular to monitor the process for producing the lithography masks and to improve the masks produced. The method can additionally be used to sort out mask blanks which do not satisfy specific predefined quality criteria at an early stage in the production process.

It has been recognized according to the invention that it is possible, by use of a speckle pattern measurement, in the context of a 3D aerial image measurement which is regularly carried out anyway during a lithography mask measurement, to separate an imaging aberration contribution from a mask structure contribution to the speckle pattern. The imaging aberration contribution can then be represented, with the result that from this a qualification of the imaging optical unit can be carried out and, in particular, conclusions can be drawn regarding the extent to which said imaging aberration contribution can be reduced for example by means of a readjustment of the imaging optical unit of the metrology system. A separation can be carried out by means of determining a z-position of an intersection point of a profile of the focus dependence of the real part and the imaginary part of the respective spectral component. The method can be used to determine in particular aberrations which can be described by use of even functions.

The imaging optical unit can be part of a metrology system, in particular for the qualification of lithography masks and of still unstructured mask substrates, so-called mask blanks. A qualification of mask blanks, that is to say an assessment of the quality of still unstructured masks, can also be carried out with the aid of the determining method.

The defocus aberration can be calculated from a known illumination angle distribution (illumination setting) during the illumination of the measured lithography mask and also a known transmission function of the imaging optical unit. The transmission function can be a pupil transmission function. The pupil transmission function can be a binary function and have the value 1 for spatial frequencies within a numerical aperture of the imaging optical unit and 0 for spatial frequencies outside said numerical aperture.

It has been recognized according to the invention, in particular, that the speckle structures have a direct influence on the fluctuation of the linewidth of the structures on the wafer. Said influence is independent of the properties of the structures on the mask. In particular, it cannot be determined by measurement of the mask structures. It has been recognized according to the invention that said influence can best be ascertained with the aid of an actinic measurement of the mask, that is to say by a measurement of the mask using illumination radiation having a wavelength corresponding precisely to the wavelength of the illumination radiation used for imaging the mask structures.

It has been recognized, in particular, that the fluctuation of the linewidth in the aerial image is composed of the independent constituents of the fluctuation of the physical linewidth of the masks scaled with a so-called mask error enhancement factor (MEEF), on the one hand, and a structure-independent contribution, which hereinafter is also referred to as optical surface roughness of the mask or, for simplification, as surface roughness of the mask. No method for separating these different contributions has existed heretofore.

The present method serves in particular for determining the optical surface roughness of the mask.

In accordance with one aspect of the invention, evaluating the 2D intensity distributions comprises ascertaining a defocus dependence of the standard deviation of the detected 2D intensity distributions.

It has been found that the optical surface roughness of the mask can be ascertained from said defocus dependence, in particular from the gradient of the contrast that increases linearly as the defocus increases.

In accordance with a further aspect of the invention, evaluating the 2D intensity distributions comprises the following steps:

determining a spectrum $S(\vec{v}, z)$ of the 2D intensity distributions by Fourier transformation of the 2D intensity distributions, determining a defocus dependence of a plurality of spectral components $S(v_{xi}, v_{yi})$ of the spectrum $S(\vec{v}, z)$, and ascertaining a Fourier-transformed function for describing the optical surface roughness of the lithography mask from the determined defocus dependence of the spectral components.

Provision is made, in particular, for determining the focus dependence of a real part $RS(z)$ and an imaginary part $IS(z)$ of a plurality of the spectral components $S(v_{xi}, v_{yi})$ of the spectrum $S(\vec{v}, z)$ in the frequency domain. The Fourier transform $H(\vec{v})$ of the object roughness $h(\vec{r})$ can now be ascertained from the linear regression line of the spectral components as a function of the defocus.

Preferably, evaluating the 2D intensity distributions comprises exclusively Fourier transformations and linear algebra. It is therefore implementable in a particularly simple manner. It is additionally very robust.

In accordance with a further aspect of the invention, evaluating the 2D intensity distributions comprises ascertaining intensity fluctuations. The intensity fluctuations can be ascertained in particular directly from the recorded aerial images.

In accordance with one aspect of the invention, evaluating the 2D intensity distributions comprises ascertaining a speckle contrast. The speckle contrast is ascertained in particular from an aerial image of the structure-free measurement region.

The speckle contrast is ascertained in particular under the same imaging conditions, in particular with the same illumination setting, which are used for evaluating the surface roughness of the mask.

In accordance with a further aspect of the invention, evaluating the 2D intensity distributions comprises ascertaining a speckle correlation factor w. The latter is a dimensionless factor. The speckle correlation factor describes in particular the correlation of the speckles in spatial regions which are spaced apart from one another by a critical dimension.

In accordance with a further aspect of the invention, the speckle correlation factor is derived from a known defocus aberration function. If the mask has a flat roughness spectrum, the correlation factor can be derived directly from the defocus aberration function.

In accordance with a further aspect of the invention, a mirror-symmetrical illumination setting is used for illuminating the measurement region. The illumination setting used corresponds, in particular, precisely to a predefined illumination setting which is provided for a later lithography method for imaging the mask structures onto a wafer.

In accordance with a further aspect of the invention, at least partially coherent illumination radiation, in particular coherent illumination radiation, is used for illuminating the measurement region. This corresponds to the conditions provided during a later imaging of the mask structures onto a wafer.

In accordance with a further aspect of the invention, illumination radiation having a wavelength in the EUV range, in particular in the wavelength range of 5 nm to 30 nm, in particular illumination radiation having a wavelength of 13.5 nm or 7 nm, is used for illuminating the measurement region. An actinic method is thus involved.

The metrology system for carrying out the method described above comprises an illumination optical unit for illuminating the measurement region with illumination radiation, an imaging optical unit for imaging the measurement region onto a spatially resolving detection device, and a detection device of this type.

In accordance with a further aspect of the invention, a computing device for evaluating the 2D intensity distributions of the recorded focus stack is connected to the detection device in a data-transferring manner.

BRIEF DESCRIPTION OF DRAWINGS

Further details and advantages of the invention will become apparent from the description of exemplary embodiments with reference to the figures. In the figures.

DETAILED DESCRIPTION

Figure 1:
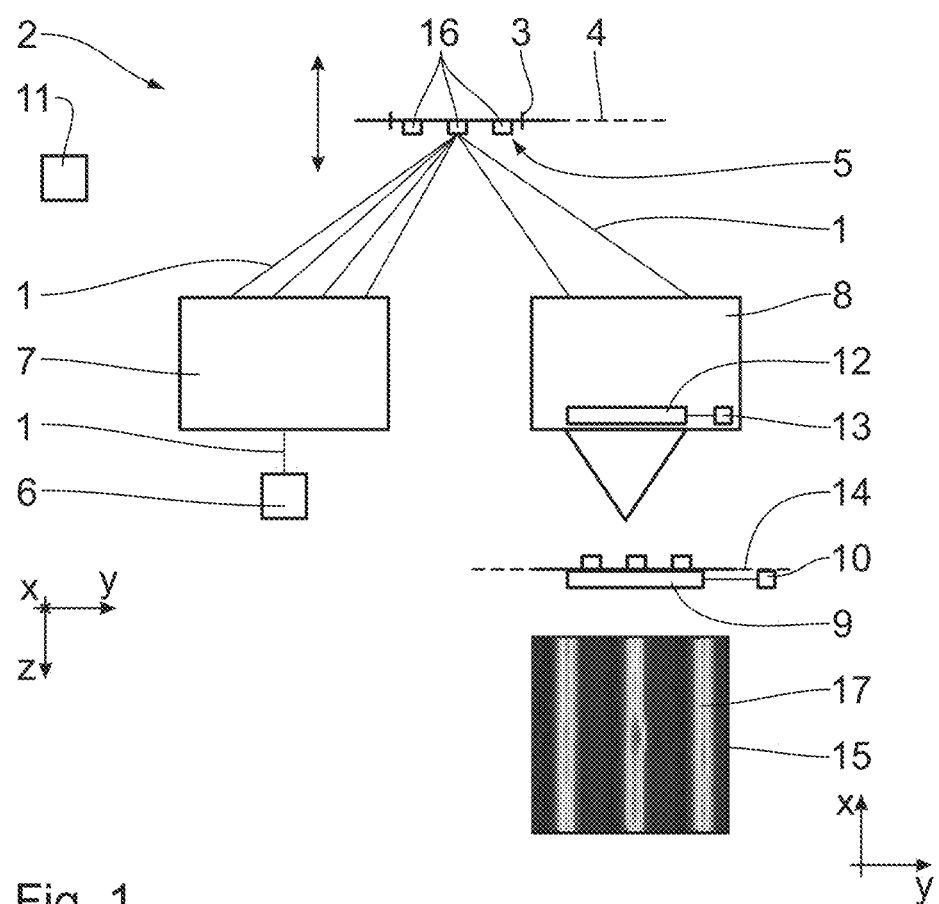
FIG. 1 shows highly schematically, in a plan view looking in a direction perpendicular to a plane of incidence, a metrology system for the examination of an object in the form of a lithography mask with EUV illumination and imaging light with an illumination optical unit and an imaging optical unit, each of which is illustrated extremely schematically.

In order to facilitate the presentation of positional relationships, a Cartesian xyz-coordinate system is used hereinafter. In FIG. 1, the x-axis runs perpendicularly to the plane of the drawing into the latter. The y-axis runs towards the right in FIG. 1. The z-axis runs downwards in FIG. 1.

FIG. 1 shows in a view corresponding to a meridional section a beam path of EUV illumination light and imaging light 1 in a metrology system 2 for the examination of an object 5, arranged in an object field 3 in an object plane 4, in the form of a reticle or a lithography mask or a mask blank with the EUV illumination light 1. The metrology system 2 is used for analyzing a three-dimensional (3D) aerial image (Aerial Image Metrology System) and serves for simulating and analyzing the effects of properties of lithography masks, known as reticles, which in turn are used during projection exposure for producing semiconductor components, on the optical imaging by projection optical units within a projection exposure apparatus. Such systems are known from WO 2016/012426 A1 (cf. FIG. 1 therein), from US 2013/0063716 A1 (cf. FIG. 3 therein), from DE 102 20 815 A1 (cf. FIG. 9 therein) and from DE 102 20 816 A1 (cf. FIG. 2 therein) and from US 2013/0083321 A1.

The illumination light 1 is reflected at the object 5. A plane of incidence of the illumination light 1 lies parallel to the yz-plane.

The EUV illumination light 1 is produced by an EUV light source 6. The light source 6 may be a laser plasma source (LPP; laser produced plasma) or a discharge source (DPP; discharge produced plasma). In principle, a synchrotron-based light source may also be used, for example a free electron laser (FEL). A used wavelength of the EUV light source may lie in the range between 5 nm and 30 nm. In principle, in the case of a variant of the metrology system 2, a light source for another used light wavelength may also be used instead of the light source 6, for example a light source for a used wavelength of 193 nm.

Depending on the embodiment of the metrology system 2, it may be used for a reflective object 5 or else for a transmissive object 5. One example of a transmissive object is a phase mask.

An illumination optical unit 7 of the metrology system 2 is arranged between the light source 6 and the object 5. The illumination optical unit 7 serves for the illumination of the object 5 to be examined with a defined illumination intensity distribution over the object field 3 and at the same time with a defined illumination angle distribution with which the field points of the object field 3 are illuminated.

For example, a numerical aperture of the illumination and imaging light 1 of the metrology system 2 is 0.0825 on the reticle side. The object field 3 in the object plane 4 has an extent of 8 µm in the x-direction and of 8 µm in the y-direction, that is to say is square.

After reflection at the object 5, the illumination and imaging light 1 enters an imaging optical unit or projection optical unit 8 of the metrology system 2, which is likewise indicated schematically in FIG. 1. The imaging optical unit 8 serves for imaging the object 5 towards a spatially resolving detection device 9 of the metrology system 2. The detection device 9 is designed, e.g. as a CCD detector or CMOS detector.

The detection device 9 is signal-connected to a digital computing device in the form of an image processing device 10.

The object 5 is carried by an object holder (not illustrated). Said object holder can be displaced by use of a displacement drive on the one hand parallel to the xy-plane and on the other hand perpendicular to this plane, that is to say in the z-direction. The displacement drive, and likewise the entire operation of the metrology system 2, is controlled by a central control device 11, which, in a manner not illustrated in more specific detail, is signal-connected to the components to be controlled.

By way of example, FIG. 1 illustrates an imaging component 12 of the imaging optical unit 8, which can be a mirror or, with the use of illumination light wavelengths longer than EUV wavelengths, a lens element. The imaging component 12 is operatively connected to a displacement actuator 13, which is in turn signal-connected to the control device 11. By use of the displacement actuator 13, the imaging component 12 can be displaced independently of one another in the x-direction and/or in the y-direction and/or in the z-direction for the precise alignment of the imaging component 12. A spatial resolution of this displacement can be better than 10 µm and can in particular be better than 2 µm.

A magnification factor of the imaging optical unit 8 is greater than 500, and is 850 in the exemplary embodiment according to FIG. 1. A resulting image-side numerical aperture in the region of an image plane 14, in which a 3D aerial image of the object 5 arises, is in the region of $1 \cdot 10^{-4}$.

Below the detection device 9, a plan view of a 2D intensity distribution 15 in a measurement plane (e.g. z=0) is represented by way of example in FIG. 1. Structures 16 on the reticle 5 are represented as intensity maxima 17 running in the x-direction.

Figure 2:
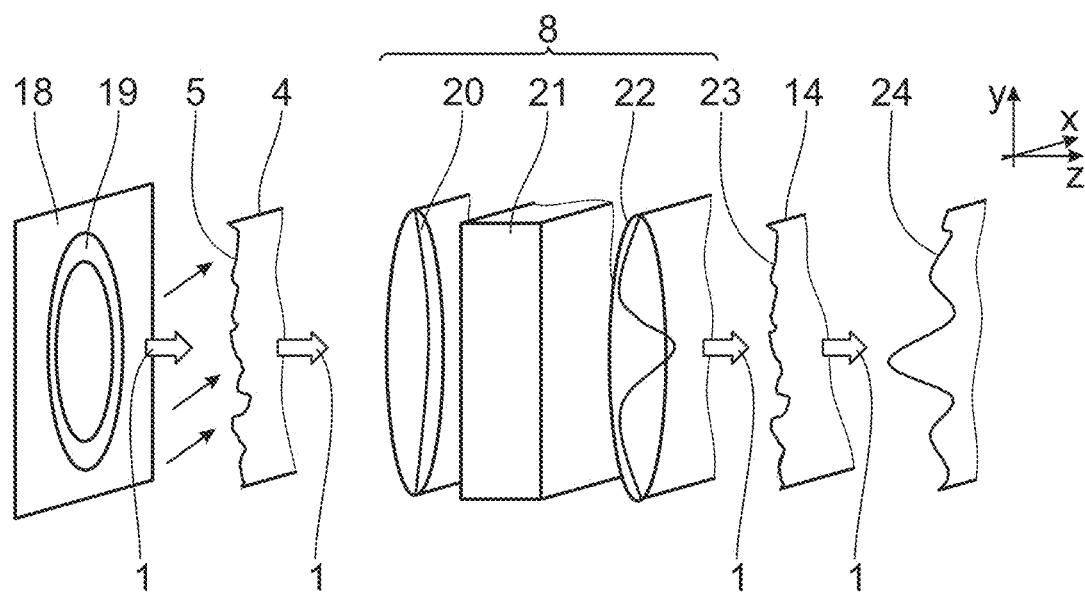
FIG. 2 schematically shows a propagation of the illumination and imaging light between an illumination pupil and an aerial image in the region of an image plane of the imaging optical unit, wherein a conversion of the aerial image into a spectrum of a speckle pattern is additionally illustrated as well.

FIG. 2 schematically shows a propagation of the illumination and imaging light 1 from a pupil plane 18 of the illumination optical unit 7 right into the region of the image plane 14. The variables or components respectively concerned are indicated perspectively in the xyz-coordinate system. A pupil intensity distribution 19 of the illumination light 1 is present in the pupil plane 18, said distribution also being referred to as an illumination setting. A ring-shaped or annular pupil intensity distribution 19 is illustrated by way of example. The pupil intensity distribution 19 is represented mathematically as $\sigma(\kappa)$.

In this case, $\sigma$ is the illumination intensity and $\kappa$ describes the location at which said illumination intensity is present, in pupil coordinates.

The illumination light 1 propagates from the pupil plane 18 into the object plane 4, where the illumination light 1 is incident on the object 5, which has a roughness illustrated in an exaggerated fashion in FIG. 2. This results in a wavefront $$\frac{4\pi}{\lambda}h(\vec{r}) + \vec{r}\vec{\kappa}$$

and a field distribution of the illumination light 1, which can be written as $$s(\vec{r}, \vec{\kappa}) \sim \left(1 + i\frac{4\pi}{\lambda}h(\vec{r})\right)e^{i\vec{r}\vec{\kappa}}$$

The designations here have the following meanings:

$\vec{r}$: Spatial coordinate vector having coordinates xy;

$\lambda$: Wavelength of the illumination light;

h: Roughness of the object (sagittal height in the z-direction)

After being reflected at or passing through the object 5, the illumination light 1 propagates through an entrance pupil 20 of the imaging optical unit 8, the imaging components of which are indicated at 21 in FIG. 2, and afterwards through an exit pupil 22. Afterwards, the object 5 is imaged into an aerial image 23 in the region of the image plane 14. A Fourier transformation of the respective 2D intensity distribution in the x- and y-directions, that is to say a "slice" of the aerial image 23, yields a speckle spectrum 24, that is to say a spectrum $S(\vec{v})$ of a speckle pattern of the aerial image 23. The following holds true for said speckle spectrum:

$$S(\vec{v}) \approx -\frac{8\pi}{\lambda} H(\vec{v})\Theta(\vec{v})$$

Here it holds true that:
v: The frequency-proportional wavenumber $1/\lambda$ having frequency coordinates $v_x$, $v_y$;
H: Roughness spectrum, that is to say the Fourier transformation of the object roughness h;
$\Theta(\vec{v})$ Aberration function of the optical unit, which is in turn defined as:

$$\Theta(\vec{v})=(\sigma P \otimes \varphi_e P)(\vec{v})-(\sigma \varphi_e P \otimes P)(\vec{v})$$

Here it holds true that:
σ Intensity distribution of the illumination setting in a pupil plane;
P: Pupil transmission function of the optical unit, that is to say for example the effect of pupil limiting by an aperture and/or obscuration stop;
$\varphi_e$ The even wavefront aberration of the optical unit, that is to say an aberration contribution that can be described by an even function.

Figure 3:
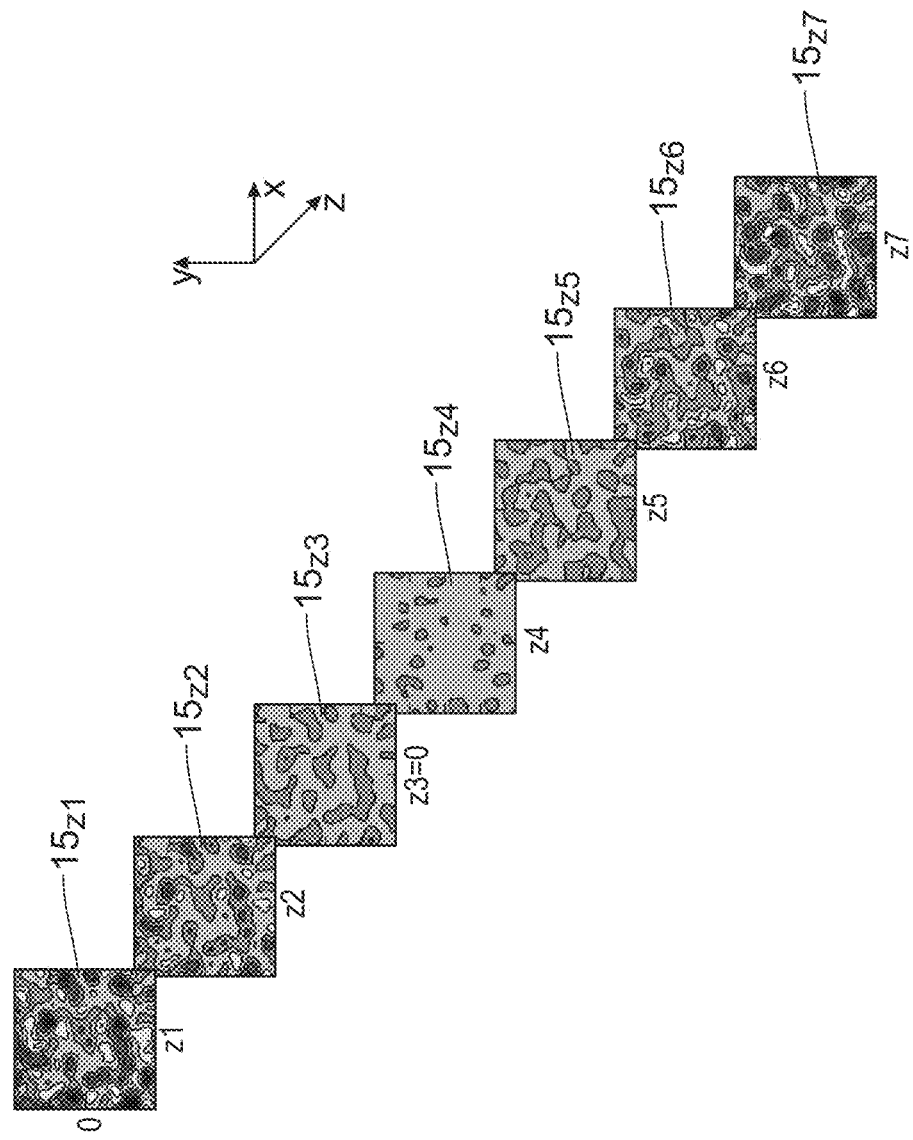
FIG. 3 shows a sequence of 2D intensity distributions in different focus measurement planes in the region of the image plane (focus stack), wherein this sequence represents a 3D aerial image which can be measured by the metrology system.
Figure 4:
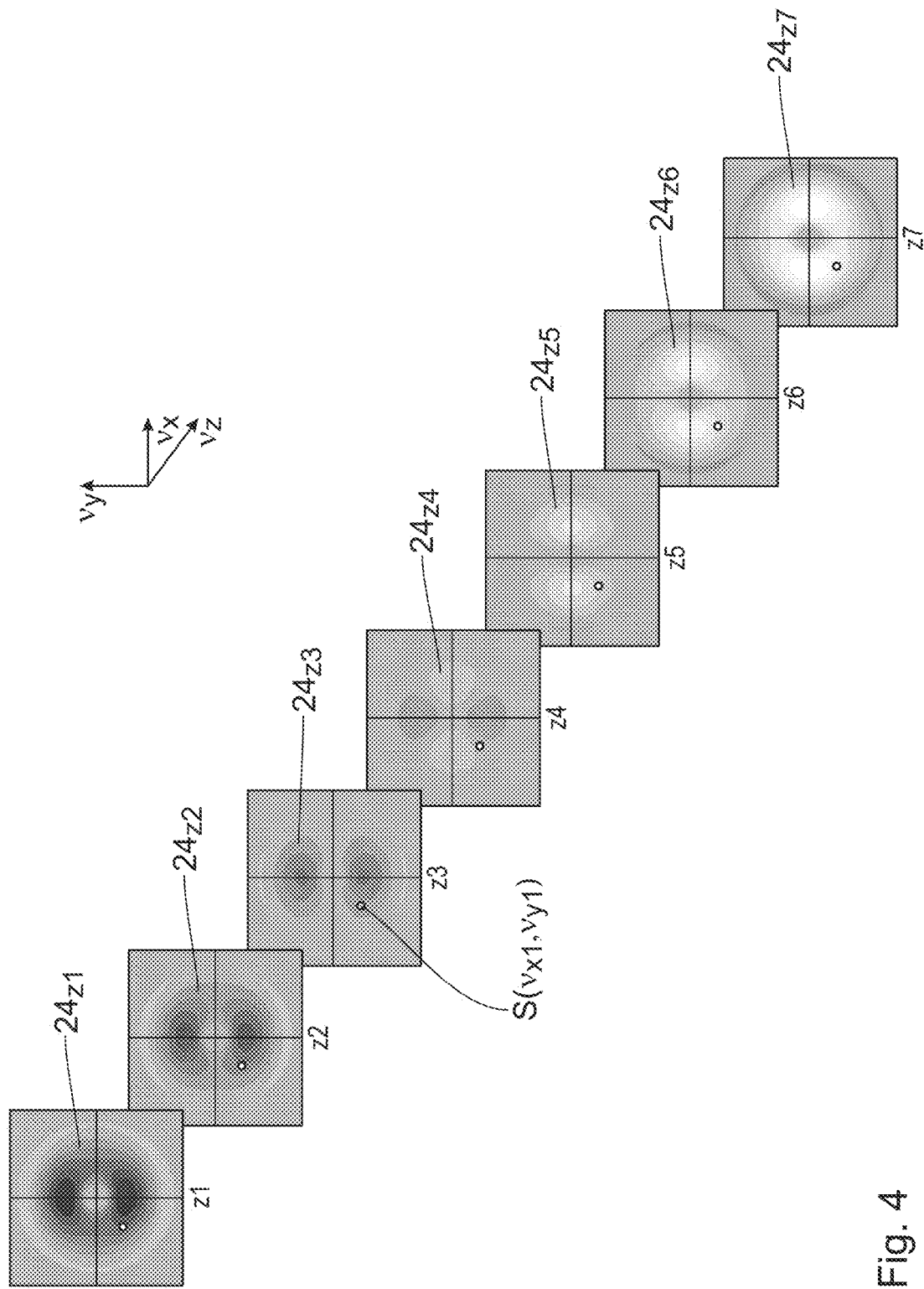
FIG. 4 shows, in a manner assigned to the sequence according to FIG. 3, a sequence of spectra of a speckle pattern of the 3D aerial image, determined by Fourier transformation of the 2D intensity distributions according to FIG. 3.
Figure 6:
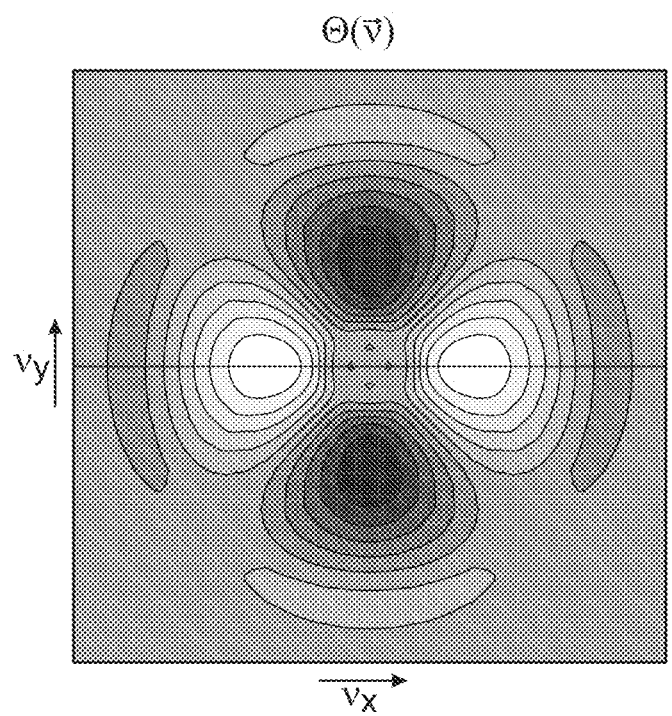
FIG. 6 shows by way of example an ascertained imaging aberration of the imaging optical unit of the metrology system, represented as a frequency-dependent aberration function, which imaging aberration arises as the result of a separation from specific values of the focus dependence of the spectral components in the manner of the spectral components according to FIG. 5.

A method for determining an imaging aberration contribution of the imaging optical unit 8 is explained below with reference to FIG. 3 et seq. The grey-scale values indicated in FIGS. 3, 4 and 6 are in each case a measure of the light intensity present at the location respectively considered.

What is carried out firstly is a focus-dependent measurement of the 3D aerial image 23 of the imaging optical unit 8 as a sequence of 2D intensity distributions $15_{z1}$ to $15_{z7}$ in different measurement planes z1 to z7 in the region parallel to the image plane 14 (z3=0) of the imaging of the object 5. In this case, in contrast to the illustration according to FIG. 1, what is imaged is not a structured object, but rather a (still) unstructured mask, that is to say a mask blank or a non-structured region of a mask. The aerial image that is recorded over the sequence of the 2D intensity distributions $15_{zi}$ shows a spatial distribution of speckles, which can be understood as the result firstly of a mask (remainder) structure contribution and of an imaging aberration contribution of the imaging optical unit 8.

This is then followed by determining the spectrum $S(\vec{v})$ of said speckle pattern of the 3D aerial image detected in the preceding step by means of Fourier transformation of the 2D intensity distributions $15_{zi}$. This results in a sequence of 2D speckle spectra $24_{z1}$ to $24_{z7}$, as a function of the frequency coordinates $v_x$ and $v_y$.

The sequence of the 2D intensity distributions $15_{zi}$ to $15_{z7}$ is also referred to as a focus stack.

Figure 5:
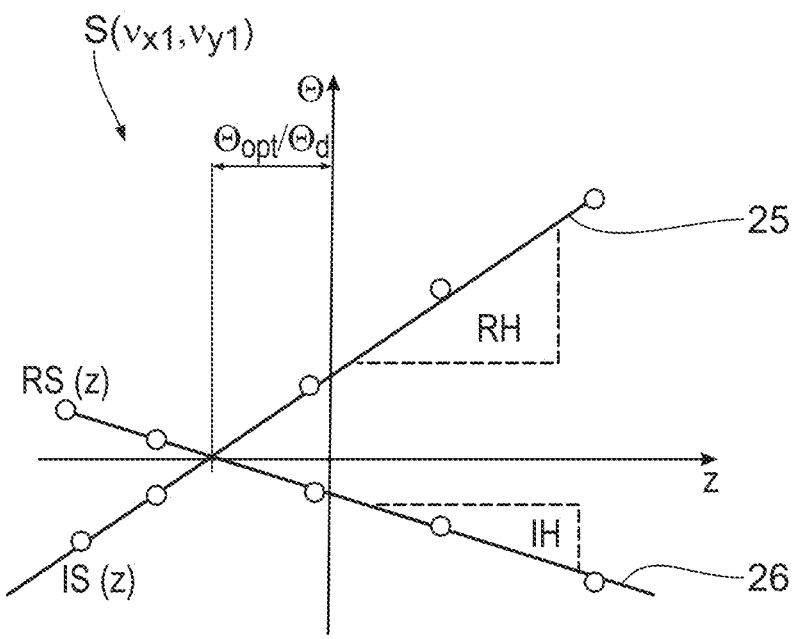
FIG. 5 shows schematic profiles of a real part and an imaginary part of a selected spectral component of the speckle pattern spectra according to FIG. 4 as a function of a focus position (z-direction perpendicular to the image plane)

Afterwards, for a plurality of spectral components $S(v_{xi}, v_{yi})$ in the frequency domain, a focus dependence of a real part RS(z) and an imaginary part IS(z) of this speckle spectral component $S(v_{xi}, v_{yi})$ is determined. This is illustrated for one spectral component $S(v_{xi}, v_{yi})$ highlighted by a selection point in FIG. 4. For this spectral component S, FIG. 5 schematically shows a linearly approximated profile 25 of the real part RS(z) of this speckle spectral component $S(v_{xi}, v_{yi})$ and a likewise linearly approximated profile 26 of the imaginary part IS(z) of this spectral component $S(v_{xi}, v_{yi})$, as a function of the z-coordinate, that is to say as a function of the focus position.

The following holds true for these z-dependencies of the speckle spectral component:

$$S(z) \sim H(\Theta_d z + \Theta_{opt})$$

Here it holds true that:
H: Contribution of the roughness of the object;
$\Theta_d$: Defocus aberration of the imaging optical unit;
$\Theta_{opt}$: Other imaging aberration contribution of the imaging optical unit;

The defocus aberration $\Theta_d$ of the imaging optical unit 8 can be calculated from the known illumination setting and the known transmission function of the optical unit. On the basis of the profiles 25 and 26 of the real part RS and the imaginary part IS, on the basis of the above formula it is possible to separate the imaging aberration contribution $\Theta$ from the roughness contribution H and the other imaging aberration $\Theta_{opt}$ of the imaging optical unit 8 then results after independent determination of the defocus aberration.

In particular the z-position of the intersection point between the profiles 25, 26 of the real part RS and the imaginary part IS can be used for this separation.

The imaging aberration contribution $\Theta_{opt}$ can be written in a frequency-dependent manner as an expansion in respect of Zernike aberration functions $\Theta_n$ having an expansion coefficient $z_n$.

$$\Theta_{opt}(\vec{v}) = \frac{1}{\lambda}\sum_n z_n \Theta_n(\vec{v})$$

Here it holds true that:

$$\Theta_n(\vec{v})=2\pi(\sigma P \otimes Z_n P)(\vec{v})-(\sigma Z_n P \otimes P)(\vec{v})$$

with the Zernike polynomials $Z_n(\vec{v})$.

FIG. 6 shows the separated imaging aberration contribution $\Theta(\vec{v})$ by way of example. For the chosen illumination setting, this imaging aberration contribution has great similarity to the Zernike function Z5.

Figure 7:
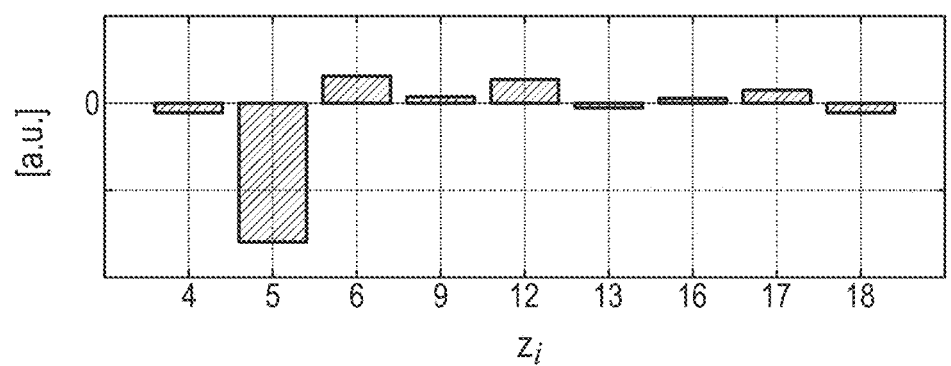
FIG. 7 shows a representation of the imaging aberration contribution according to FIG. 6 in the form of an expansion in respect of Zernike polynomials.

FIG. 7 shows the sequence of the coefficients $z_i$ of the above expansion formula for the Zernike functions Z4 to Z18. As expected the main contribution is manifested at the coefficient $z_5$ for the Zernike function Z5.

Overall, therefore, the imaging aberration contribution of the imaging optical unit 8 can be measured on the basis of the measurement of an unstructured location of the mask that is regularly required anyway in metrology. Said imaging aberration contribution can then be corrected by readjusting optical components of the imaging optical unit 8. For this purpose, the control device 11 can drive the displacement actuator 13 for the corresponding displacement of the imaging component 12. Such readjustment can be carried out in pauses in operation of the metrology system 2 or else during the operation of the metrology system 2. The readjustment can be carried out by open-loop control or else, by comparison between setpoint and actual values of respective imaging aberration contributions, by closed-loop control.

This expansion of the imaging aberration contribution by Zernike functions $Z_i$ constitutes one example of an expansion of the imaging aberration contribution over a linear combination of a set of orthogonal functions.

The optical set-up of the metrology system 2 serves for the most exact possible emulation of an illumination and an imaging in the course of a projection exposure of the object 5 during the projection-lithographic production of semiconductor components.

For details regarding the focus-dependent measurement of the 2D aerial image 23, reference is made to WO 2016/012426 A1. With regard to details in connection with Fourier transformation, too, reference is made to WO 2016/012426 A1 and the references mentioned therein.

The application of the method described above in a method for determining a structure-independent contribution of a lithography mask to a fluctuation of the linewidth (LWR, linewidth roughness) is described below.

It has been recognized according to the invention that the surface roughness of an EUV mask, in particular of a mask blank, and also the inhomogeneities of the multilayer structure thereof lead to phase variations in the illumination radiation reflected from the mask. These phase variations lead to intensity variations in the aerial image, which are also referred to as speckles. Such speckles have a direct influence on the minimum achievable fluctuation of the linewidth and thus of the smallest structures still producible reliably on the wafer.

Particularly for the monitoring and optimization of the lithography method, it is advantageous if the phase variations caused by the mask blank, in particular the structure-independent contribution of the mask to a fluctuation of the linewidth, is ascertained. This contribution is independent of the fluctuation of the width of the mask structures that are actually to be imaged. A method for separating the structure-dependent from the structure-independent contributions to the fluctuation of the linewidth in the aerial image or on the wafer has not been known heretofore.

In accordance with a first alternative, provision is made for measuring phase variations caused by the mask directly in the aerial image with the aid of an actinic method. For this purpose, a focus stack, that is to say a sequence of different 2D intensity distributions $15_{zi}$ at different focus positions $z_i$, is recorded. In particular a purely reflective or a purely absorbent region serves as a measurement region. The measurement region is in particular free of structures to be imaged. In the case of a mask blank, the entire mask can be free of structures to be imaged.

The results of the evaluation of the 2D intensity distributions $15_{zi}$, which results are described in even greater detail below, can be combined with separate measurements of the line roughness of the mask structures, if present. This can be used to improve the lithography masks and, in particular, the mask blanks and thus the lithography process per se and, in particular, the micro- or nanostructured components produced with the aid of a lithography method.

A first alternative involves ascertaining the standard deviation of the 2D intensity distributions $15_{zi}$ of the focus stack as a function of the focus position $z_i$. This is also referred to as speckle contrast.

From the spectrum $S(\vec{v})$ ascertained, it is possible to calculate directly the speckle contrast $\Delta I$, that is to say the standard deviation of the aerial image intensity, that is to say of the recorded 2D intensity distributions $15_{zi}$.

$$\Delta I^2 = \frac{1}{A}\int (I(\vec{r})-1)^2 d\vec{r} = \frac{\lambda^2}{(2\pi NA)^2}\int |S(\vec{v})|^2 d\vec{v}$$

$$\Delta I^2 = \frac{4}{NA}\int |H(\vec{v})\Theta(\vec{v})|^2 d\vec{v}$$

Assuming a flat spectrum of the optical surface roughness, the speckle contrast increases linearly as the defocus increases. The root mean square (RMS) of the optical surface roughness of the mask can be calculated directly from the gradient of the speckle contrast as a function of the focus position.

However, this yields a root mean square averaged over the entire region evaluated. Spatial and spectral information about the surface roughness is lost here. Such details can be determined with the aid of the method described above for determining the different contributions of the mask structure and the imaging optical unit to the speckle pattern spectrum. As has already been described above, it is possible to represent the Fourier transform of the recorded aerial images, in particular the speckle spectrum as a function of the focus position, as a function of the Fourier transformation of the surface roughness of the mask, of a defocus aberration function $\Theta_d$ and of a real aberration function $\Theta_{opt}$ of the imaging optical unit 9.

The roughness spectrum $H(\vec{v})$ can be determined from the gradient of the regression line of the spectral components $S(v_{xi}, v_{yi})$ of the speckle spectrum $S(v, z)$.

It is thus possible to ascertain the complex spectrum $H(\vec{v})$ of the surface roughness $h(\vec{r})$ within the optical resolution of the imaging optical unit 8, which is a function of the numerical aperture of the imaging optical unit 8 and the numerical aperture of the illumination optical unit 7. Further information about the cause of the surface roughness of the mask 5 can be ascertained from the spatial and spectral properties of the surface roughness h.

In addition, the contribution of the surface roughness of the mask to the fluctuation of the linewidth can also be ascertained from a direct measurement of intensity fluctuations in the 2D intensity distributions $15_{zi}$. It has been recognized that the structure-independent contribution of the surface roughness of the mask $LWR_{Blank}$ as a function of the measured intensity variations of the 2D intensity distributions $15_{zi}$ can be represented as follows:

$$LWR_{surface\,roughness} = 3\frac{I_0 \Delta I}{I'_0} w$$

$\Delta I$ here denotes the speckle contrast in the measurement region which is free of structures to be imaged.

$I_0$ denotes the limit intensity for which the critical dimension CD is ascertained. $I'_0$ indicates the gradient of the aerial image intensity profile of a structure whose roughness is intended to be ascertained. The latter can be determined either from an additional aerial image measurement of the line structure or from aerial image simulations.

w is a dimensionless factor indicating the correlation of the speckle patterns in regions spaced apart by the critical dimension. It is also referred to as the speckle correlation factor w. For vertical lines parallel to the y-axis, w is defined as follows:

$$w = \sqrt{2\left(1 + \frac{\langle \Delta I(x, y)\Delta I(x+CD, y)\rangle}{\Delta I^2}\right)}$$

In this case, $\Delta I(x,y)=I_{Blank}(x,y)-1$ is ascertained from an aerial image of a blank or of a region without structures to be imaged. This is carried out under the same imaging conditions (defocus and illumination setting) for which the fluctuation of the linewidth is ascertained. $\Delta I$ is the corresponding speckle contrast.

In the case of a mask having a flat roughness spectrum, the speckle correlation factor w can also be determined directly from the known defocus aberration function $\Theta_d$ as follows:

$$w = \sqrt{2\left(1 + \frac{\int |\Theta_{defocus}(\vec{k})|^2 e^{-iCDk_x} d\vec{k}}{\int |\Theta_{defocus}(\vec{k})|^2 d\vec{k}}\right)}$$

The following holds true: $0 \leq w \leq 2$.

The features described above related to processing of data can be implemented by the image processing device 10, or be implemented in digital electronic circuitry, or in computer hardware, firmware, software, or in combinations of them. The features related to processing of data includes, e.g., evaluating 2D intensity distributions of the recorded focus stack in a spatially resolved manner, ascertaining a defocus dependence of the standard deviation of the detected 2D intensity distributions, determining a spectrum of the 2D intensity distributions by Fourier transformation of the 2D intensity distributions, determining a defocus dependence of a plurality of spectral components of the spectrum, ascertaining a Fourier transform of a function for describing the optical surface roughness of the lithography mask from the determined defocus dependence of the spectral components. The features can be implemented in a computer program product tangibly embodied in an information carrier, e.g., in a machine-readable storage device, for execution by a programmable processor; and method steps can be performed by a programmable processor executing a program of instructions to perform functions of the described implementations by operating on input data and generating output. Alternatively or addition, the program instructions can be encoded on a propagated signal that is an artificially generated signal, e.g., a machine-generated electrical, optical, or electromagnetic signal, that is generated to encode information for transmission to suitable receiver apparatus for execution by a programmable processor.

In some implementations, the operations associated with processing of data described in this document can be performed by one or more programmable processors executing one or more computer programs to perform the functions described in this document. A computer program can be written in any form of programming language, including compiled or interpreted languages, and it can be deployed in any form, including as a stand-alone program or as a module, component, subroutine, or other unit suitable for use in a computing environment.

For example, the imaging processing device 10 is suitable for the execution of a computer program and can include, by way of example, both general and special purpose microprocessors, and any one or more processors of any kind of digital computer. Generally, a processor will receive instructions and data from a read-only storage area or a random access storage area or both. Elements of a computer include one or more processors for executing instructions and one or more storage area devices for storing instructions and data. Generally, a computer will also include, or be operatively coupled to receive data from, or transfer data to, or both, one or more machine-readable storage media, such as hard drives, magnetic disks, magneto-optical disks, or optical disks. Machine-readable storage media suitable for embodying computer program instructions and data include various forms of non-volatile storage area, including by way of example, semiconductor storage devices, e.g., EPROM, EEPROM, and flash storage devices; magnetic disks, e.g., internal hard disks or removable disks; magneto-optical disks; and CD-ROM and DVD-ROM discs.

In some implementations, the processes for determining an imaging aberration contribution of an imaging optical unit for measuring lithography masks described above can be implemented using software for execution on one or more mobile computing devices, one or more local computing devices, and/or one or more remote computing devices. For instance, the software forms procedures in one or more computer programs that execute on one or more programmed or programmable computer systems, either in the mobile computing devices, local computing devices, or remote computing systems (which may be of various architectures such as distributed, client/server, or grid), each including at least one processor, at least one data storage system (including volatile and non-volatile memory and/or storage elements), at least one wired or wireless input device or port, and at least one wired or wireless output device or port.

In some implementations, the software may be provided on a medium, such as a CD-ROM, DVD-ROM, or Blu-ray disc, readable by a general or special purpose programmable computer or delivered (encoded in a propagated signal) over a network to the computer where it is executed. The functions may be performed on a special purpose computer, or using special-purpose hardware, such as coprocessors. The software may be implemented in a distributed manner in which different parts of the computation specified by the software are performed by different computers. Each such computer program is preferably stored on or downloaded to a storage media or device (e.g., solid state memory or media, or magnetic or optical media) readable by a general or special purpose programmable computer, for configuring and operating the computer when the storage media or device is read by the computer system to perform the procedures described herein. The inventive system may also be considered to be implemented as a computer-readable storage medium, configured with a computer program, where the storage medium so configured causes a computer system to operate in a specific and predefined manner to perform the functions described herein.

While this specification contains many specific implementation details, these should not be construed as limitations on the scope of any inventions or of what may be claimed, but rather as descriptions of features specific to particular embodiments of particular inventions. Certain features that are described in this specification in the context of separate embodiments can also be implemented in combination in a single embodiment. Conversely, various features that are described in the context of a single embodiment can also be implemented in multiple embodiments separately or in any suitable subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described above should not be understood as requiring such separation in all embodiments.

Thus, particular embodiments of the subject matter have been described. Other embodiments are within the scope of the following claims. In some cases, the actions recited in the claims can be performed in a different order and still achieve desirable results.

What is claimed is:

1. A method for determining a structure-independent contribution of a lithography mask to a fluctuation of the linewidth (LWR, linewidth roughness) comprising the following steps:
   1.1. providing an optical system having an imaging optical unit for imaging lithography masks,
   1.2. providing a lithography mask having at least one measurement region which is free of structures to be imaged,
   1.3. illuminating the at least one measurement region with illumination radiation,
   1.4. recording a focus stack of the at least one measurement region of the lithography mask, and
   1.5. evaluating 2D intensity distributions of the recorded focus stack in a spatially resolved manner,
   1.6. wherein evaluating the 2D intensity distributions comprises ascertaining a defocus dependence of the standard deviation of the detected 2D intensity distributions, and
   1.7. wherein evaluating the 2D intensity distributions comprises the following steps:
      1.7.1. determining a spectrum $S(\vec{v}, z)$ of the 2D intensity distributions by Fourier transformation of the 2D intensity distributions,
      1.7.2. determining a defocus dependence of a plurality of spectral components $S(v_{xi}, v_{yi})$ of the spectrum $S(\vec{v}, z)$, and
      1.7.3. ascertaining a Fourier transform $H(\vec{v})$ of a function for describing the optical surface roughness of the lithography mask from the determined defocus dependence of the spectral components $S(v_{xi}, v_{yi})$.

2. The method according to claim 1, wherein evaluating the 2D intensity distributions comprises exclusively Fourier transformations and linear algebra.

3. The method according to claim 2, wherein evaluating the 2D intensity distributions comprises ascertaining intensity fluctuations.

4. The method according to claim 3, wherein evaluating the 2D intensity distributions comprises ascertaining a speckle contrast ($\Delta I$).

5. The method according to claim 4, wherein evaluating the 2D intensity distributions comprises ascertaining a speckle correlation factor.

6. The method according to claim 5, wherein the speckle correlation factor (w) is derived from a known defocus aberration function.

7. The method according to claim 1, wherein a mirror-symmetrical illumination setting is used for illuminating the measurement region.

8. The method according to claim 1, wherein at least partially coherent illumination radiation is used for illuminating the measurement region.

9. The method according to claim 1, wherein coherent illumination radiation is used for illuminating the measurement region.

10. The method according to claim 1, wherein illumination radiation having a wavelength in the EUV range is used for illuminating the measurement region.

* * * * *

UNITED STATES PATENT AND TRADEMARK OFFICE
CERTIFICATE OF CORRECTION

PATENT NO. : 11,061,331 B2  
APPLICATION NO. : 16/280469  
DATED : July 13, 2021  
INVENTOR(S) : Markus Koch et al.

Page 1 of 1

It is certified that error appears in the above-identified patent and that said Letters Patent is hereby corrected as shown below:

On the Title Page

Column 2  
(Other Publications), Line 12, delete "9422112-1 - 942214-6" and insert -- 942214-1 - 942214-6 --

In the Claims

Column 13  
Lines 27-28 (Approx.), in Claim 1, delete "$S(\vec{v},,z)$" and insert -- $S(\vec{v},z)$ --

Signed and Sealed this  
Fifth Day of October, 2021

Drew Hirshfeld  
*Performing the Functions and Duties of the*  
*Under Secretary of Commerce for Intellectual Property and*  
*Director of the United States Patent and Trademark Office*